US009514945B2

(12) United States Patent
Hong et al.

(10) Patent No.: US 9,514,945 B2
(45) Date of Patent: Dec. 6, 2016

(54) NANOCRYSTAL MEMORY AND METHODS FOR FORMING SAME

(71) Applicants: Cheong Min Hong, Austin, TX (US); Euhngi Lee, Austin, TX (US)

(72) Inventors: Cheong Min Hong, Austin, TX (US); Euhngi Lee, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/568,155

(22) Filed: Dec. 12, 2014

(65) Prior Publication Data

US 2016/0172199 A1 Jun. 16, 2016

(51) Int. Cl.
*H01L 21/28* (2006.01)
*H01L 27/115* (2006.01)

(52) U.S. Cl.
CPC .... *H01L 21/28282* (2013.01); *H01L 27/11517* (2013.01); *H01L 27/11563* (2013.01)

(58) Field of Classification Search
CPC .................... H01L 27/11517; H01L 29/42324; H01L 21/28282; H01L 27/11563; H01L 29/792; H01L 29/66833
See application file for complete search history.

(56) References Cited

U.S. PATENT DOCUMENTS

| | | | | |
|---|---|---|---|---|
| 7,799,634 | B2 | 9/2010 | Shen et al. | |
| 7,871,886 | B2 * | 1/2011 | Hong | B82Y 10/00 257/E21.422 |
| 7,985,649 | B1 | 7/2011 | Winstead et al. | |
| 8,643,123 | B2 * | 2/2014 | Hong | H01L 21/28273 257/410 |
| 2008/0290399 | A1 | 11/2008 | Levy et al. | |
| 2009/0020831 | A1 | 1/2009 | Ramkumar et al. | |

OTHER PUBLICATIONS

Kizilyalli, I.C. et al, "Improvement of Hot Carrier Reliability with Deuterium Anneals for Manufacturing Multilevel Metal/Dielectric MOS Systems," IEEE Electron Device Letters, vol. 19, No. 11; Nov. 1998, pp. 444-446.

Hess, K. et al., "Giant Isotope Effect in Hot Electron Degradation of Metal Oxide Silicon Devices," IEEE Transactions on Electron Devices, vo. 45, No. 2; Feb. 1998; pp. 406-416.

* cited by examiner

*Primary Examiner* — Yu-Hsi D Sun

(57) ABSTRACT

A charge-storing device includes a charge-storing layer including nanocrystals. The nanocrystals are formed by a deposition technique incorporating deuterated hydrides. The deuterated hydride can be used to form an amorphous semiconductor material that is annealed to form nanoparticles to be incorporated into the charge-storing layer.

20 Claims, 5 Drawing Sheets

NANOCRYSTAL MEMORY AND METHODS FOR FORMING SAME

FIELD OF THE DISCLOSURE

This disclosure, in general, relates to semiconductor memory devices including nanocrystals, systems using semiconductor memory devices and methods for forming such memory devices.

BACKGROUND

The computer industry seeks ever advancing improvements in the performance of processors and memory. For processors, industry seeks ever-increasing clock speeds and processing throughput with reduced power consumption. For semiconductor memory, industry seeks increasing capacity, lower error rates, and increased durability. Semiconductor memory devices utilizing nanocrystals provide several technical advantages over other charge-storing memory devices. However, the performance of memory devices utilizing nanocrystals can degrade over time.

In particular, nanocrystals can be used in electrically erasable programmable read only memory (EEPROM) structures, which can be used in integrated circuits for non-volatile data storage. EEPROM device structures can include a polysilicon floating gate formed over a tunnel dielectric, which is formed over a semiconductor substrate, to store charge. As device dimensions and power supply voltages decrease, the thickness of the tunnel dielectric cannot correspondingly decrease in order to prevent data retention failures. An EEPROM device using isolated silicon nanocrystals or nanoparticles as a replacement to the floating gate does not have the same vulnerability to isolated defects in the tunnel dielectric and thus, permits scaling of the tunnel dielectric and the operating voltage without compromising data retention.

But, the programming and erasing cycling of nanocrystal memory can trap electrons in the bit cell stack including the floating gate and can and increase the erase voltage. Over time, increased trapping can result in increased read voltage, which can result in degraded read performance.

As such, improved nanocrystal memory devices would be desirable.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

Semiconductor devices that include nanoparticles or nanocrystals formed using deuterated hydride deposition may contain a portion of deuterium within or at the surface of the nanoparticles or nanocrystals. Such deuterium is believed to limit unexpected electron trapping within memory cells, which reduces erase voltages and provides for long-term read performance.

In an exemplary embodiment, nanoparticles or nanocrystals of a memory device are formed utilizing deuterated hydride. In an example, a dielectric layer is formed over a semiconductor substrate. An amorphous semiconductor material is deposited over the dielectric layer and annealed in an inert atmosphere to form nanoparticles. In a particular example, the amorphous semiconductor material can be deposited using a deuterated hydride, such as a deuterated silane or germane. Optionally, additional amorphous semiconductor material can be deposited over the dielectric layer and agglomerate to form larger nanoparticles following further annealing. Optionally, further annealing steps can be performed in the presence of oxygen or nitrogen containing species. The nanoparticles can form nanoparticles or nanocrystals as a result of the annealing. A further dielectric layer can be formed over and at least partially surrounding the nanoparticles followed by the deposition of a conductive material over the dielectric layer. Such a structure can be used to form a charge-storing stack of a memory device.

In further example, a semiconductor device includes a dielectric layer disposed over the semiconductor material, nanoparticles disposed over the dielectric layer and including deuterium, a further dielectric layer disposed over the nanoparticles and partially surrounding the nanoparticles, and a conductive layer disposed over the dielectric layer. Such layers can form a charge-storing stack over the semiconductor substrate, which can include source/drain regions and a semiconductor region disposed between the source/drain regions. In a particular example, the charge-storing stack can form part of a split-gate memory device.

Figure 1:
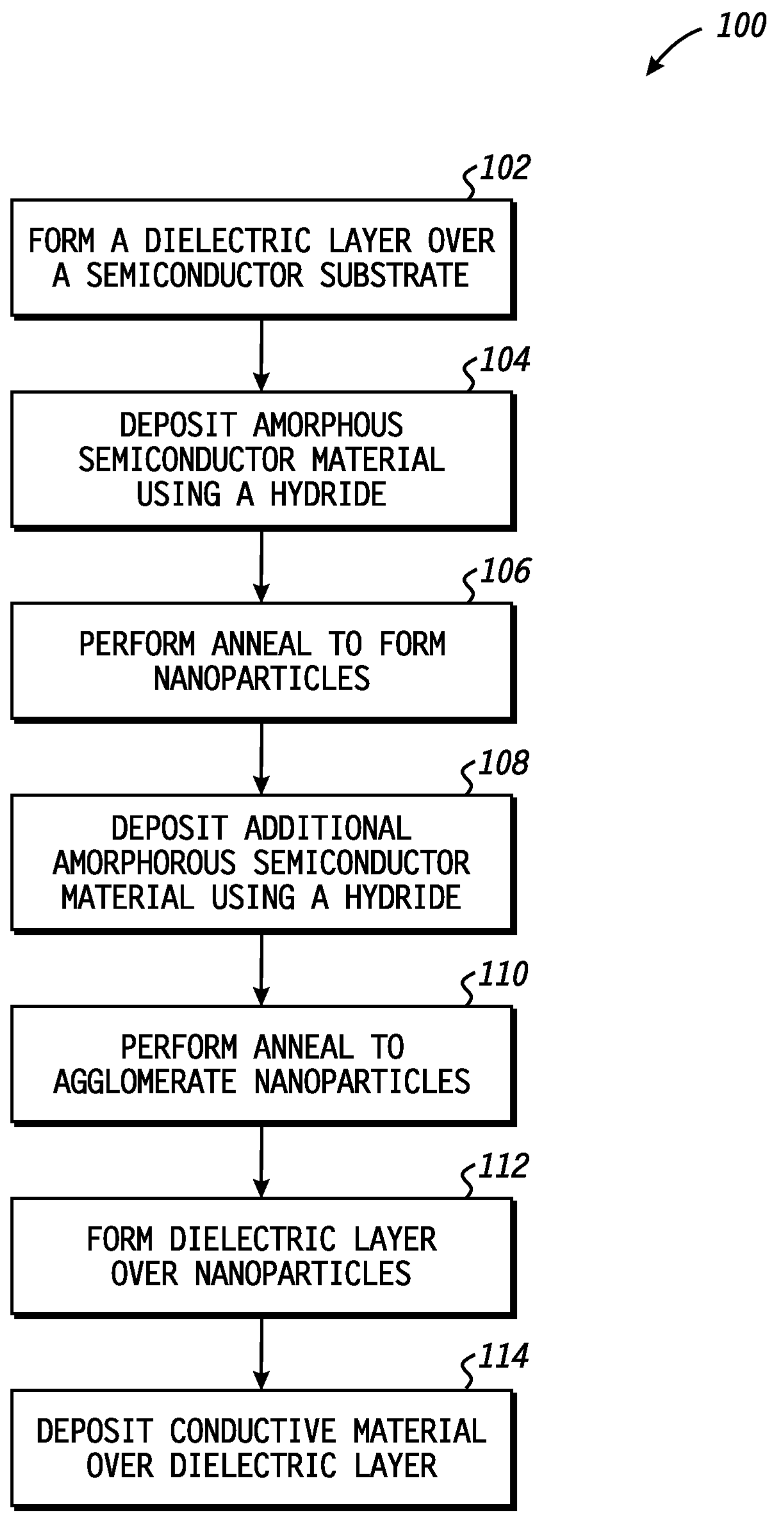
FIG. 1 includes a block flow diagram illustrating an exemplary method for forming a nanoparticle memory device.
Figure 2:
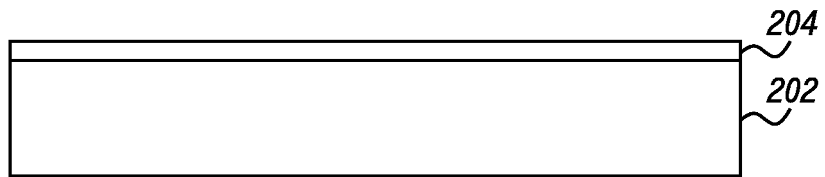
FIG. 2, FIG. 3, FIG. 4, FIG. 5, FIG. 6, and FIG. 7 include illustrations of a workflow for forming a nanoparticle memory device.

FIG. 1 illustrates an exemplary method 100 for forming a semiconductor device incorporating nanoparticles. In particular, the method 100 includes forming a dielectric layer over a semiconductor substrate, as illustrated at 102. For example, as illustrated in FIG. 2, a dielectric layer 204 can be deposited over the semiconductor substrate 202. The semiconductor substrate can include a semiconductor material, such as silicon, germanium, gallium arsenide, the like, or any combination thereof. The dielectric layer, also referred to as a tunneling layer, can be an oxide or nitride of a metal or semi-metal. For example, the dielectric layer can be an oxide of silicon, silicon nitride, oxynitride of silicon, the like, or a combination thereof.

Figure 3:
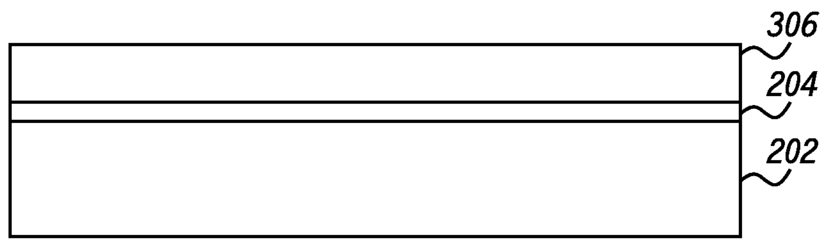

As illustrated at 104, an amorphous semiconductor material can be deposited over the dielectric layer in an inert atmosphere. For example, FIG. 3 illustrates an amorphous semiconductor material layer 306 disposed over the dielectric layer 204. Deposition can be performed using a chemical vapor deposition (CVD), plasma enhanced chemical vapor deposition (PECVD), or sputtering. Atomic layer deposition (ALD can be used and is considered a type of CVD.

The amorphous semiconductor material can be deposited using a hydride. In particular, the hydride can be deuterated in which at least a portion of the hydrogens are replaced with deuterium. For example, the hydride can be fully deuterated or partially deuterated. Exemplary deuterated hydride can include deuterated hydrides of silicon, germanium, gallium, arsenic, or a combination thereof. For example, the deuterated hydride can include silane, disilane, trisilane, tetrasilane, germane, digermane, trigermane, tetragermane, the like, or combinations thereof, in which the hydrogens are completely or at least partially replaced with deuterium. In a particular example, the deuterated hydride includes deuterated or partially deuterated silane, disilane, or trisilane. In a further example, the semiconductor material can be deposited using a mix of hydride gases in which some species are deuterated and other species are not. For example, the mix can include deuterated hydride species, relative to non-deuterated hydride species, in a ratio in a range of 1:0 to 2:8, such as a range of 1:0 to 5:5 or a range of 1:0 to 8:2.

The amorphous semiconductor material can be deposited using the deuterated hydride in an inert atmosphere at a temperature in a range of 300° C. to 650° C., such as a temperature in a range of 400° C. to 650° C., a range of 450° C. to 650° C., or a range of 500° C. to 650° C. The deposition can occur for a period in a range of 1 second to 200 seconds in the inert atmosphere, such as a range of 5 seconds to 50 seconds, or even a range of 7 seconds to 30 seconds.

An inert atmosphere can include an inert gas, such as nitrogen or a noble gas, such as argon. The hydride or the mixture of hydrides can be included in the gas phase during the deposition in an amount relative to the inert gas (e.g., nitrogen) in a ratio of 1:10000 to 1:99, such as a range of 1:50000 to 1:200, a range of 1:2000 to 1:300, a range of 1:1000 to 1:400, or even a range of 1:700 to 1:500.

The amorphous semiconductor material can be deposited to a thickness in a range of 10 Å to 100 Å, such as a range of 20 Å to 50 Å or a range of 30 Å to 40 Å.

Figure 4:
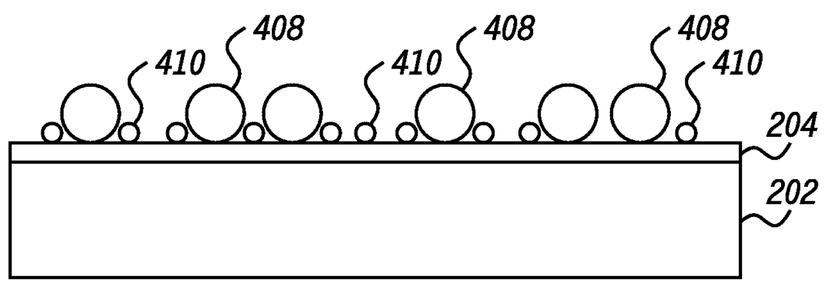

Returning to FIG. 1, as illustrated at 106, annealing can be performed to form nanoparticles. For example, as illustrated at FIG. 4, the amorphous semiconductor material 306 de-wets from the dielectric layer to form nanoparticles 408 or 410. In particular, the annealing can be performed in an inert atmosphere absent oxygenated species. The anneal can be performed at a temperature in a range of 600° C. to 1150° C., such as a range of 700° C. to 1150° C. The anneal can be performed for a period in the range of 1 second to 60 seconds, such as 5 seconds to 60 seconds, or 10 seconds to 60 seconds. In particular, the annealing can be performed in a rapid thermal annealing chamber.

The process of depositing amorphous semiconductor material and annealing to de-wet the semiconductor material to form nanoparticles can be repeated. As illustrated at 108 of FIG. 1, additional amorphous semiconductor material can be deposited using a hydride in the presence of an inert atmosphere. Such deposition of amorphous semiconductor material can be performed following the first annealing, as illustrated at 106. The amorphous semiconductor material can be deposited using a hydride and optionally, a deuterated hydride, such as the deuterated hydrides described above. For example, the deuterated hydride can include deuterated or partially deuterated silane, disilane, or trisilane. Deposition can be performed using a chemical vapor deposition (CVD), plasma enhanced chemical vapor deposition (PECVD), or sputtering. In a further example, the semiconductor material can be deposited using a mix of hydride gases in which some species are deuterated and other species are not. For example the mix can include deuterated hydride species, relative to non-deuterated hydride species, in a ratio in a range of 1:0 to 2:8, such as a range of 1:0 to 5:5 or a range of 1:0 to 8:2.

The amorphous semiconductor material can be deposited using the deuterated hydride in an inert atmosphere at a temperature in a range of 300° C. to 650° C., such as a temperature in a range of 400° C. to 650° C., a range of 450° C. to 650° C., or a range of 500° C. to 650° C. The deposition can occur for a period in a range of 1 second to 200 seconds in the inert atmosphere, such as a range of 5 seconds to 50 seconds, or even a range of 7 seconds to 30 seconds. The hydride or the mixture of hydrides can be include in the gas phase during the deposition in an amount relative to the inert gas (e.g., nitrogen) in a ratio in a range of 1:10000 to 1:99, such as a range of 1:50000 to 1:200, a range of 1:2000 to 1:300, a range of 1:1000 to 1:400, or even a range of 1:700 to 1:500. The amorphous semiconductor material can be deposited to a thickness in a range of 10 Å to 100 Å, such as a range of 20 Å to 15 Å, or a range of 30 Å to 40 Å.

Figure 5:
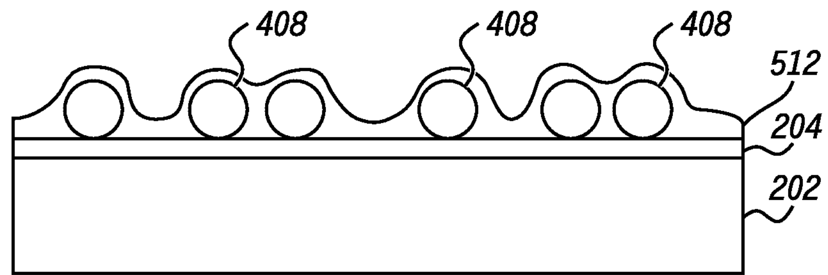
Figure 6:
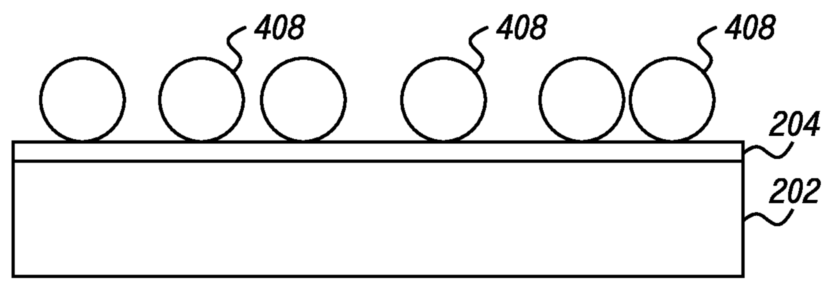

For example, as illustrated in FIG. 5, additional amorphous material 512 can be deposited between and over the nanoparticles 408 and can be annealed to further agglomerate the particles 408, as illustrated in FIG. 6. In particular, as illustrated at 110 of FIG. 1, an additional anneal can be performed to agglomerate the nanoparticles, forming larger particles. In particular, annealing can be performed in an inert atmosphere absent oxygenated species. Annealing can be performed at a temperature in a range of 600° C. to 1150° C., such as a range of 700° C. to 1150° C. The anneal can be performed for a period in the range of 1 second to 60 seconds, such as 5 seconds to 60 seconds, or 10 seconds to 60 seconds. In particular, the annealing can be performed in a rapid thermal annealing chamber. The nanoparticles 408 can have average diameter in a range of 15 Å to 500 Å, such as an average diameter in a range of 100 Å to 300 Å or in a range of the 150 Å to 250 Å.

Optionally, additional annealing in the presence of an oxygenated or nitrous species can be performed following the deposition of the amorphous semiconductor material and annealing, between the depositions of amorphous semiconductor material and deposition of additional amorphous semiconductor material, or following deposition of additional amorphous semiconductor material. Such annealing in the presence of an oxygenated or nitrous species can provide sealing of the nanoparticle surface by terminating surface groups with nitrogen or oxygen. In particular, nitridation can be performed to at least partially seal the nanoparticles before deposition of an insulation layer.

For example, additional annealing in the presence of oxygen or nitrous containing species can be performed. The species can include $O_2$, $N_2O$, NO, the like, or any combination thereof. In particular, the additional annealing can be performed in the presence of a nitrous species, such as $N_2O$, NO, or any combination thereof. The optional annealing in the presence of the species can be performed at a temperature in a range of 300° C. to 1050° C. for a period in the range of 1 second to 60 seconds. For example, the annealing in the presence of the species can be performed at a temperature in the range of 600° C. to 1050° C. such as a range of 600° C. to 850° C.

Figure 7:
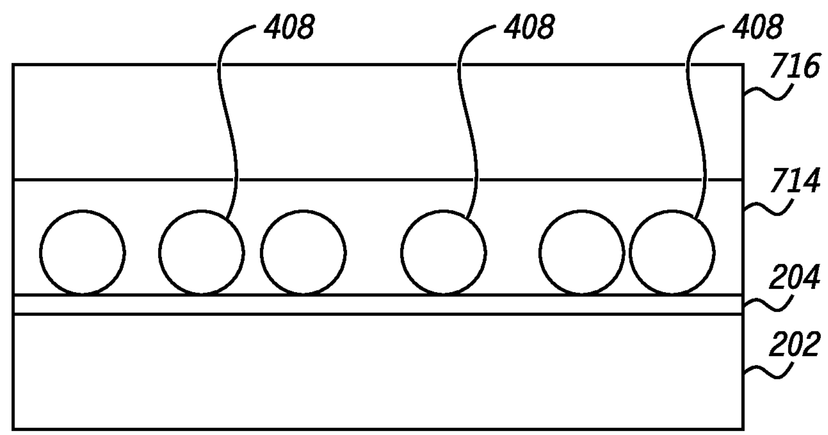

Returning to FIG. 1, a dielectric or insulator layer can be formed over and partially encompass the nanoparticles, as illustrated at 112. As illustrated in FIG. 7, the nanoparticles or nanocrystals 408 can be encompassed in a dielectric or insulator layer 714, for example. In a particular example, the dielectric or insulator layer can include an oxide deposited using chemical vapor deposition, such as rapid thermal chemical vapor deposition (RTCVD). In an example, the insulator or dielectric layer 714 can be a high temperature oxide dielectric material. Following deposition, the high temperature oxide layer can be annealed in the presence of nitrogen for a period in a range of 1 to 50 hours, such as a range of 30 minutes to 1.5 hours or a range of 45 minutes to 75 min. Subsequently, an additional oxygen anneal can be performed, such as in an RTP furnace.

As illustrated in FIG. 7, a conductive material 716 can be deposited over the dielectric layer 714 encompassing the nanoparticles 408. For example, as illustrated at 114 of FIG. 1, a conductive material can be deposited over the dielectric layer (e.g., the dielectric layer 714 of FIG. 7). For example, a polycrystalline layer of semiconductor material, such as silicon or germanium, can be deposited over the dielectric or insulator layer. One or more metal silicide or metal layers can be deposited over the conductive material layer to form structures useful for a charge-storing device.

In a particular example, the nanoparticles deposited as described above can find use in the form of a charge-storing device. An exemplary charge-storing device includes a split gate semiconductor device, such as a split gate nonvolatile memory cell. A memory cell can be formed by depositing a charge-storing layer incorporating deuterated nanoparticles or nanocrystals over the variable conductivity region of a substrate.

Figure 8:
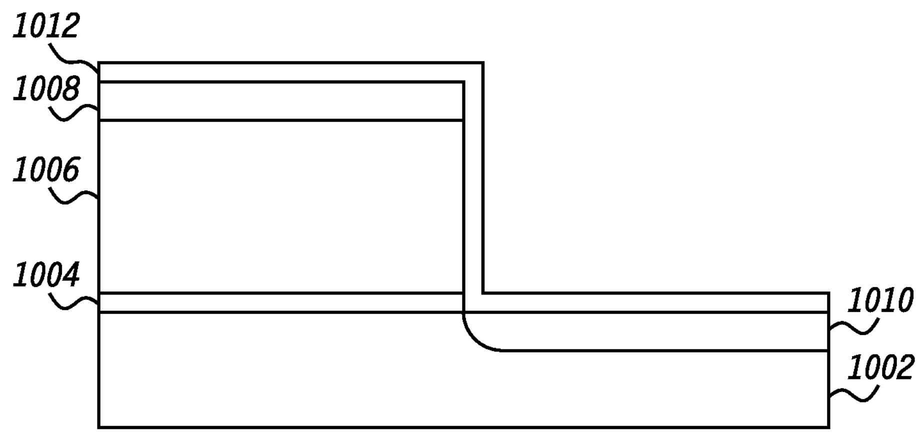
FIG. 8, FIG. 9, FIG. 10, and FIG. 11 include illustrations of a workflow for forming a split gate memory device including nanoparticles.

As illustrated in FIG. 8, a dielectric layer 1004 is disposed over a substrate 1002, and a conductive layer 1006 is disposed over the dielectric layer 1004. Optionally, an antireflective coating 1008 can be disposed over the conductive layer 1006. Optionally, a counter-doped region 1010 can be formed in the substrate 1002 at a location adjacent the region underlying the conductive layer 1006. A dielectric layer 1012, also referred to as a tunneling layer, can be deposited over the counter-doped region 1010 and optionally along the side of the conductive material 1006. Alternatively, the dielectric layer 1012 can be a grown oxide, such as a thermally grown oxide.

Figure 9:
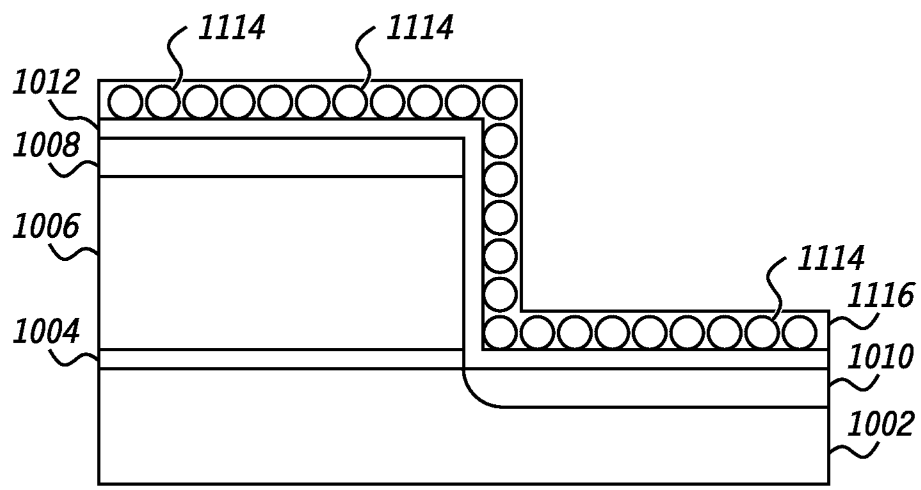

As illustrated in FIG. 9, a dielectric or insulator layer 1116 that incorporates nanocrystals 1114 can be formed over the dielectric layer 1012. Such nanocrystals 1114 and the encapsulating dielectric or insulator layer 1116 can be formed using the processes described above. The nanocrystals 1114 are disposed within the charge-storing layer 1116 at a density in a range of $1\times10^{10}$ nanoparticles/cm$^2$ to $1\times10^{13}$ nanoparticles/cm$^2$, such as $1\times10^{11}$ nanoparticles/cm$^2$ to $5\times10^{12}$ nanoparticles/cm$^2$. The material of the dielectric or insulator layer 1116 can include a metal oxide, such as an oxide of silicon, for example, a high temperature oxide of silicon.

Figure 10:
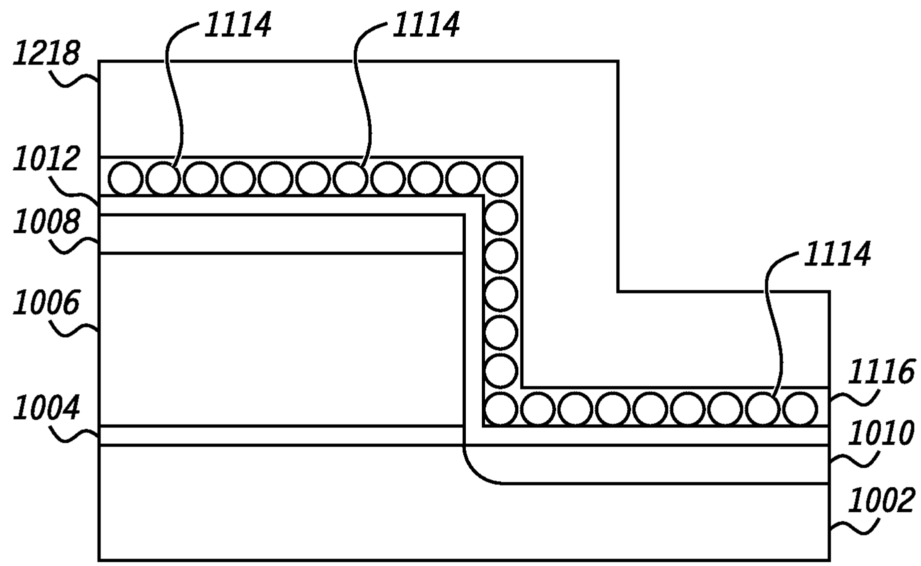

A conductive layer 1218 can be formed over the insulator layer 1116, as illustrated in FIG. 10. The conductive layer 1218 can include polycrystalline semi-metals, metal silicide, other conductive materials, the like, or combinations thereof. For example, the polycrystalline semi-metal can include polycrystalline silicon.

Figure 11:
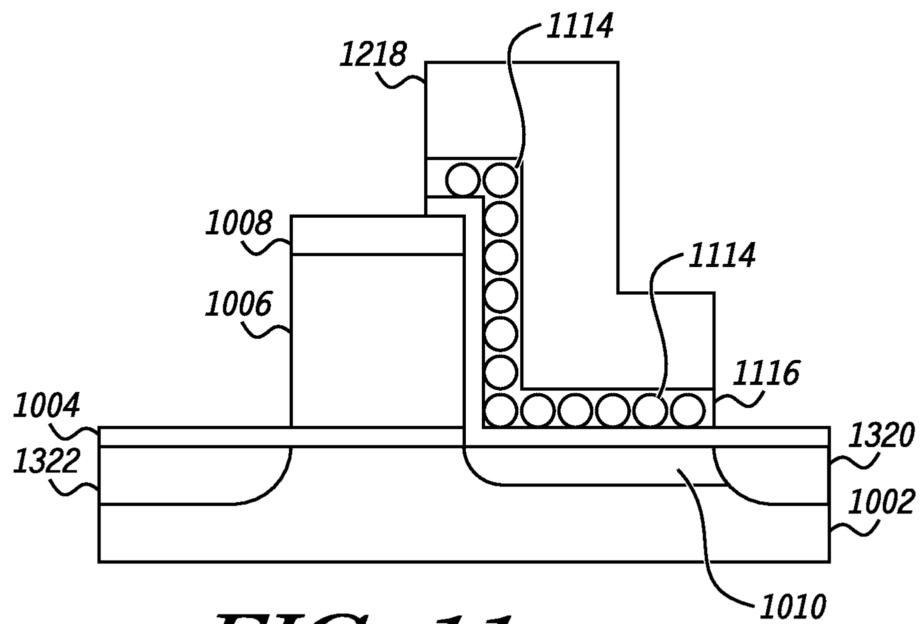

As illustrated FIG. 11, the structures including the conductive layer 1006, the insulator layer 1116, and conductive layer 1218 can be shaped to at least partially remove the conductive layer 1218 and the dielectric or insulator layer 1116 from overlying the conductive material 1006. Source/drain regions of 1320 or 1322 can be formed in the semiconductor substrate 1002 to provide a split-gate nonvolatile memory structure.

Semiconductor devices that include nanoparticles or nanocrystals formed using deuterated hydride deposition contain a portion of deuterium within or at the surface of the nanoparticles or nanocrystals. Such deuterium is believed to limit unexpected electron trapping within memory cells, which reduces erase voltages and provides for long-term read performance.

In a first aspect, a method of making a charge storage device includes depositing an amorphous semiconductor material over a dielectric layer using a deuterated hydride; annealing in an inert atmosphere, the amorphous semiconductor material forming particles; and forming a dielectric material around the particles.

In an example of the first aspect, depositing include depositing at a temperature in a range of 300° C. to 650° C. For example, the temperature is in a range of 500° C. to 650° C.

In another example of the first aspect and the above examples, depositing includes depositing using a mixture of deuterated hydride and non-deuterated hydride.

In a further example of the first aspect and the above examples, depositing includes depositing the amorphous semiconductor material to a thickness in a range of 10 Å to 100 Å.

In an additional example of the first aspect and the above examples, the deuterated hydride includes silicon, germanium, gallium, arsenic, or any combination thereof. For example, the deuterated hydride includes silicon or germanium.

In another example of the first aspect and the above examples, the deuterated hydride includes deuterated or partially deuterated silane, disilane, or trisilane.

In a further example of the first aspect and the above examples, annealing in the inert atmosphere includes annealing in the presence of nitrogen or argon.

In an additional example of the first aspect and the above examples, annealing includes annealing at a temperature in a range of 600° C. to 1150° C.

In another example of the first aspect and the above examples, the method further includes depositing a second semiconductor material. For example, depositing the second semiconductor material includes depositing using deuterated hydride. In another example, the deuterated hydride includes deuterated or partially deuterated silane, disilane, or trisilane. In a further example, depositing the second semiconductor material includes depositing using a mixture of deuterated hydride and non-deuterated hydride. For example, depositing the second semiconductor material includes depositing to a thickness in a range of 10 Å to 100 Å. In an example, the method can further include annealing in an inert atmosphere after depositing the second semiconductor material, the second semiconductor material agglomerating with the particles. In another example, the method further includes annealing in the presence of a nitrous species after depositing the second semiconductor material and annealing.

In an additional example of the first aspect and the above examples, the method further includes forming a dielectric material around the particles to form a charge-storing layer. For example, the method further includes depositing a conductive layer over the charge-storing layer.

In a second aspect, a method of making a charge storage device includes depositing a first amorphous semiconductor material over a dielectric layer; annealing in an inert atmosphere, the first amorphous semiconductor material forming particles; depositing a second amorphous semiconductor material over the dielectric layer and the particles; and annealing in an inert atmosphere, the second amorphous semiconductor material agglomerating with the particles, wherein depositing the first amorphous semiconductor material or depositing the second amorphous material is performed using deuterated hydride.

In an example of the second aspect, depositing the first or second amorphous semiconductor materials includes depositing at a temperature in a range of 300° C. to 650° C.

In another example of the second aspect and the above examples, depositing the first or the second semiconductor materials includes depositing using a mixture of deuterated hydride and non-deuterated hydride.

In a further example of the second aspect and the above examples, depositing the first or the second semiconductor materials includes depositing to a thickness in a range of 10 Å to 100 Å.

In an additional example of the second aspect and the above examples, the deuterated hydride includes silicon, germanium, gallium, arsenic, or any combination thereof. For example, the deuterated hydride includes silicon or germanium.

In another example of the second aspect and the above examples, the deuterated hydride includes deuterated or partially deuterated silane, disilane, or trisilane.

In a further example of the second aspect and the above examples, annealing includes annealing at a temperature in a range of 600° C. to 1150° C.

In an additional example of the second aspect and the above examples, the method further includes annealing in the presence of a nitrous species following annealing in the inert atmosphere. For example, annealing in the presence of a nitrous species include annealing in the presence of NO or $NO_2$. In an example, annealing in the presence of a nitrous species includes annealing at a temperature in a range of 300° C. to 1150° C.

In another example of the second aspect and the above examples, the method further includes forming a dielectric material around the particles to form a charge storing layer. For example, the method further includes depositing a conductive layer over the charge-storing layer.

In a third aspect, a semiconductor device includes a substrate; a dielectric layer disposed over the substrate; a charge-storing layer disposed over the dielectric layer, the charge storing layer including nanoparticles comprising deuterium, the nanoparticles surrounded by a dielectric material; and a conductive material disposed over the charge storing layer.

In an example of the third aspect, the nanoparticles include silicon, germanium, gallium, arsenic, or a combination thereof.

In another example of the third aspect and the above examples, the nanoparticles have an average diameter in a range of 15 Å to 500 Å.

In a further example of the third aspect and the above examples, the nanoparticles are disposed within the charge-storing layer at a density in a range of $1\times10^{10}$ nanoparticles/$cm^2$ to $1\times10^{13}$ nanoparticles/$cm^2$.

In an additional example of the third aspect and the above examples, the dielectric material of the charge-storing layer includes a semi-metal oxide.

In another example of the third aspect and the above examples, the substrate includes a source region, a drain region, and a semiconductor region between the source and the drain, the charge-storing layer disposed over at least a portion of the semiconductor region.

In a fourth aspect, a semiconductor device includes a substrate having a gate region and source/drain regions on opposite sides of the gate region; a select gate structure disposed over a first portion of the gate region, the select gate structure including a select gate dielectric layer over the first portion of the gate region and a select gate conductive layer disposed over the dielectric layer; and a control gate structure disposed over a second portion of the gate region, the control gate structure including a charge-storing layer disposed over the second portion of the gate region and a control gate conductive layer disposed over the charge-storing layer, the charge-storing layer including nanoparticles comprising deuterium.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms “comprises,” “comprising,” “includes,” “including,” “has,” “having” or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, “or” refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of “a” or “an” are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A method of making a charge storage device, the method comprising:

depositing an amorphous semiconductor material over a dielectric layer using a deuterated hydride;

annealing, in an inert atmosphere, the amorphous semiconductor material to form particles; and forming a dielectric material around the particles.

2. The method of claim 1, wherein depositing includes depositing at a temperature in a range of 300° C. to 650° C.

3. The method of claim 2, wherein the temperature is in a range of 500° C. to 650° C.

4. The method of claim 1, wherein depositing includes depositing using a mixture of deuterated hydride and non-deuterated hydride.

5. The method of claim 1, wherein depositing includes depositing the amorphous semiconductor material to a thickness in a range of 10 Å to 100 Å.

6. The method of claim 1, wherein the deuterated hydride includes silicon, germanium, gallium, arsenic, or any combination thereof.

7. The method of claim 6, wherein the deuterated hydride includes silicon or germanium.

8. The method of claim 1, wherein the deuterated hydride includes deuterated or partially deuterated silane, disilane, or trisilane.

9. The method of claim 1, wherein annealing in the inert atmosphere includes annealing in the presence of nitrogen or argon.

10. The method of claim 1, wherein annealing includes annealing at a temperature in a range of 600° C. to 1150° C.

11. The method of claim 1, further comprising depositing a second semiconductor material.

12. The method of claim 11, wherein depositing the second semiconductor material includes depositing using deuterated hydride.

13. The method of claim 12, wherein the deuterated hydride includes deuterated or partially deuterated silane, disilane, or trisilane.

14. The method of claim 12, wherein depositing the second semiconductor material includes depositing using a mixture of deuterated hydride and non-deuterated hydride.

15. The method of claim 11, wherein depositing the second semiconductor material includes depositing to a thickness in a range of 10 Å to 100 Å.

16. The method of claim 11, further comprising annealing in an inert atmosphere after depositing the second semiconductor material, the second semiconductor material agglomerating with the particles.

17. The method of claim 16, further comprising annealing in the presence of a nitrous species after depositing the second semiconductor material and annealing.

18. The method of claim 1, further comprising forming a second dielectric material around the particles to form a charge-storing layer.

19. The method of claim 18, further comprising depositing a conductive layer over the charge-storing layer.

20. A method of making a charge storage device, the method comprising:

depositing a first amorphous semiconductor material over a dielectric layer;

annealing in an inert atmosphere, the first amorphous semiconductor material forming particles;

depositing a second amorphous semiconductor material over the dielectric layer and the particles; and annealing in an inert atmosphere, the second amorphous semiconductor material agglomerating with the particles;

wherein depositing the first amorphous semiconductor material or depositing the second amorphous material is performed using deuterated hydride.

* * * * *